(12) United States Patent
Griffin

(10) Patent No.: US 6,411,132 B2
(45) Date of Patent: *Jun. 25, 2002

(54) MATCHED CURRENT DIFFERENTIAL AMPLIFIER

(75) Inventor: Jed Griffin, Forest Grove, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/475,261

(22) Filed: Dec. 30, 1999

(51) Int. Cl.$^7$ .................................................. H03K 5/22
(52) U.S. Cl. ........................................... 327/65; 327/55
(58) Field of Search ............................ 327/52, 54, 55, 327/56, 57, 65, 560, 561, 562, 563; 330/252, 253, 254; 365/207, 208

(56) References Cited

U.S. PATENT DOCUMENTS

| | | | | |
|---|---|---|---|---|
| 3,641,450 A | * | 2/1972 | Lunn | 330/254 |
| 3,854,101 A | * | 12/1974 | Muramatsu | 330/253 |
| 3,988,692 A | * | 10/1976 | Ishigaki et al. | 330/254 |
| 5,361,040 A | * | 11/1994 | Barrett, Jr. | 330/253 |
| 5,389,891 A | * | 2/1995 | Philippe | 330/253 |
| 5,625,308 A | * | 4/1997 | Matsumoto et al. | 327/203 |
| 5,764,101 A | * | 6/1998 | Archer | 330/253 |
| 5,942,940 A | * | 8/1999 | Dreps et al. | 330/253 |
| 5,932,276 A | * | 9/1999 | Baker | 365/207 |
| 6,002,290 A | * | 12/1999 | Avery et al. | 327/333 |
| 6,051,999 A | * | 4/2000 | To et al. | 327/66 |
| 6,121,809 A | * | 9/2000 | Ma et al. | 327/246 |
| 6,147,515 A | * | 11/2000 | Ang et al. | 327/57 |

* cited by examiner

*Primary Examiner*—Matthew Smith
*Assistant Examiner*—Paul Dinh
(74) *Attorney, Agent, or Firm*—Blakely, Sokoloff, Taylor & Zafman LLP

(57) ABSTRACT

According to an embodiment of the invention, a circuit is provided that includes a first differential set and a second differential set each having a first and a second input node and a first and a second output node. The first differential set is referenced to a first supply node, and the second differential set is referenced to a second supply node. The first input node of the first differential set is coupled to the first input node of the second differential set. The second input node of the first differential set is coupled to the second input node of the second differential set. A first load element is cross coupled between the second output node of the second differential set and the first output node of the first differential set. A second load element is cross coupled between the second output node of the first differential set and the first output node of the second differential set.

15 Claims, 4 Drawing Sheets

MATCHED CURRENT DIFFERENTIAL AMPLIFIER

BACKGROUND OF THE INVENTION

1. Field of the Invention

Embodiments of the present invention relate to differential amplifier circuits.

2. Background

Differential amplifiers are used to amplify differential inputs, usually small signal differentials, at any given common mode of operation. Superior performance can be achieved by the differential amplifier which exhibits higher amplification that remains consistent, constant, across a wide common mode range. Typical differential amplifiers are specified as having a Common Mode input Range (CMR) in which a given differential gain is available. Also, typical differential amplifiers are specified with a Common Mode Rejection Ratio (CMRR) which denotes the inconsistent behavior of traditional differential amplifiers at different common modes. The CMRR typically represents a differential gain (as a function of common mode) divided by the common mode gain (which varies at different common modes). To compensate for the deficiencies of limited CMR and inconsistent CMRR across the CMR, many differential amplifiers in analog and mixed-mode chips require higher voltages and inefficient increases in power to meet an adequate range of common modes for acceptable behavior. Despite an immense amount of previous efforts, traditional designs have been notoriously far from ideal, always hampered by the paradoxical bias current inherent in differential pair configurations.

Conventional differential amplifiers use a bias current through a differential transistor pair. In metal oxide semiconductor (MOS) circuits, the differential pair features matched devices with resistive loading at their drains. Increased bias current yields greater differential gain as well as greater common mode gain. Thus, changing the bias current is not a solution to the problem of optimizing the CMRR. Increasing the common mode input voltage $V_{CM}$ helps reduce common mode gain, thus improving CMRR. But this means that the CMR will be constrained to the "high" side of the power supply. Thus, a wider CMR may only be obtained at the expense of a lower CMRR. Increasing the common mode input voltage $V_{CM}$ helps reduce common mode gain, thus improving CMRR. But this means that the CMR will be constrained to the "high" side of the power supply. Thus, a wider CMR may only be obtained at the expense of a lower CMRR.

Prior differential amplifiers also have a few other limitations. Coupling a differential amplifier to a high gain stage, for instance, typically requires level shifting, thus limiting the high gain of that stage. Also the slew rate (SR) is adversely dependent upon the CMRR. That is, when the bias current is kept low for a high CMRR, the SR is decreased.

SUMMARY

According to an embodiment of the invention, a circuit is provided that includes a first differential set and a second differential set each having a first and a second input node and a first and a second output node. The first differential set is referenced to a first supply node, and the second differential set is referenced to a second supply node. The first input node of the first differential set is coupled to the first input node of the second differential set. The second input node of the first differential set is coupled to the second input node of the second differential set. A first load element is cross coupled between the second output node of the second differential set and the first output node of the first differential set. A second load element is cross coupled between the second output node of the first differential set and the first output node of the second differential set.

DETAILED DESCRIPTION OF THE INVENTION

Referring to the figures, exemplary embodiments of the invention will now be described. The exemplary embodiments are provided to illustrate the invention and should not be construed as limiting the scope of the invention.

Figure 2:
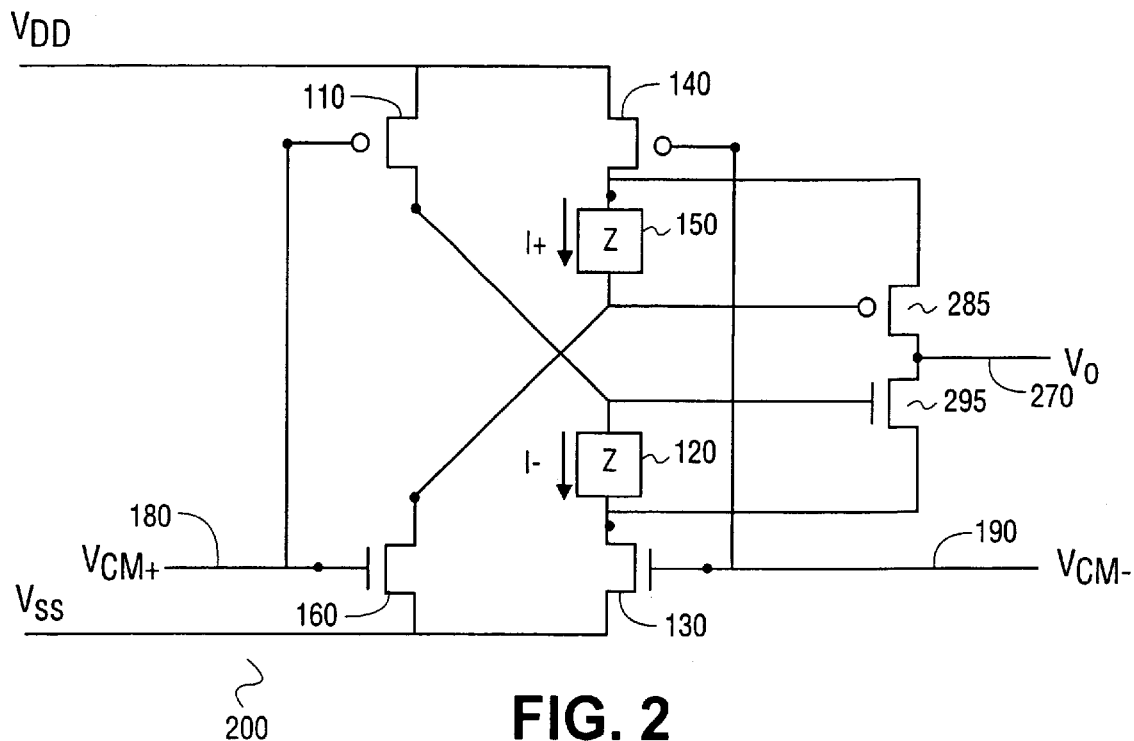
FIG. 2 is an embodiment of the present invention coupled to a gain stage.
Figure 1:
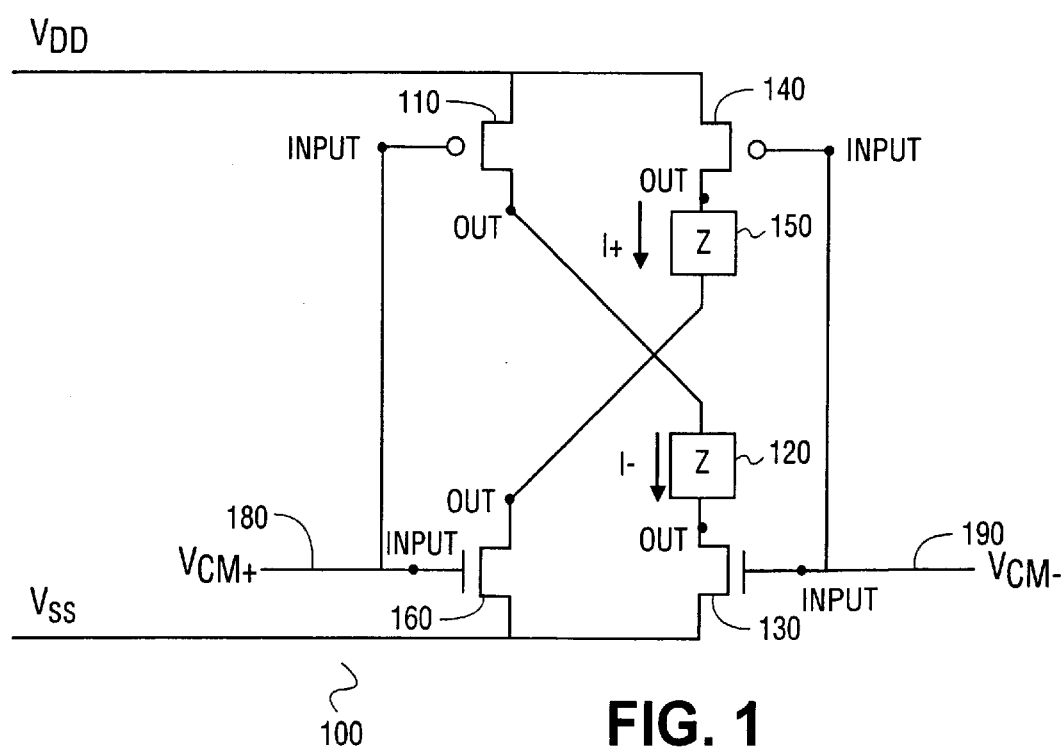
FIG. 1 is a circuit schematic of the present invention.

An embodiment of the present invention is illustrated in FIG. 1. As can be seen in the circuit 100, there are two matched differential paths comprised of two differential sets (transistors 110, 140, and transistors 130, 160) each having two input paths and two output paths. The first differential set (transistors 110 and 140) is referenced to a first supply node, $V_{DD}$. The second differential set (transistors 130 and 160) is referenced to a second supply node, $V_{SS}$. A first load element 120 is coupled between transistor 140 and transistor 160. A second load element 150 is coupled between transistor 110 and transistor 130. Differential input nodes are labeled 180 and 190. Where common input node 180 ($V_{CM+}$) is the non-inverting differential input node, and common input node 190 ($V_{CM-}$) is the inverting differential input node. Additionally, as illustrated in FIG. 2, a gain stage may be coupled to the circuit 100 resulting in the circuit 200 illustrated in FIG. 2. Note that the gain stage shown in FIG. 2 is an illustration of a typical gain stage, however, there are a number of gain stages which work equally well or better than the gain stage used for illustration here. The gain stage has a gain output node 270 coupled across the two load elements (load element 120 and load element 150.) The matched current differential amplifier coupled to a gain stage illustrated by the circuit 200 in FIG. 2 comprises p-channel metal oxide semiconductor field effect transistors (p-MOSFETs) 110 and 140 in the matched current differential amplifier, and transistor 285 in the gain stage. The circuit 200 is comprised of n-channel metal oxide semiconductor field effect transistors (n-MOSFETs) 130 and 160 in the matched current differential amplifier, and transistor 295 in the gain stage. The load elements 120 and 150 can be comprised of, but not limited to, transistors (for active resistors) or passive resistors.

If the betas of transistors 110, 130, 140 and 160, are matched to each other, and both the inverting differential input node 190 and the non-inverting differential node 180 are connected to the same voltage (a common mode between supply voltages $V_{DD}$ and $V_{SS}$) then the current through load element 150 will be the same as that of the current through load element 120. Assuming the betas of transistors 285 and 295 are matched, then the current through transistor 285 will match the current through transistor 295. The voltage at the gain output node 270 will be midway between the supply voltages, requiring no level-shifting and thus optimizing the gain at the next stage.

When the non-inverting differential input node 180 ($V_{CM+}$) increases to a higher voltage than that of the fixed common mode voltage at the inverting differential input node 190 ($V_{CM-}$), the current I+ through load element 150 increases and the current I− through load element 120 decreases. The current through transistor 285 then mirrors the increased current I+. Correspondingly, the current through transistor 295 then mirrors the decreased current of I−. This results in a higher voltage at the gain output node 270 ($V_O$). It follows that the voltage at $V_O$ 270 decreases upon the non-inverting differential input 180 ($V_{CM+}$) decreasing below the inverting differential input node that is still fixed at a common mode. Therefore, by fixing the non-inverting input 180 ($V_{CM+}$) to a common mode, $V_O$ 270 increases as $V_{CM-}$ 190 decreases, and $V_O$ 270 decreases as $V_{CM-}$ 190 increases. Since the gain output $V_O$ 270 is equally determined from current path I+ and I−, any common mode gain in the current paths I+ and I− essentially cancels.

For the embodiment when the load elements 150 and 120 are passive or active resistors with resistance R, and the betas of transistors 110, 130, 140, and 160 are matched to each other as the value β and 285 and 295 are likewise matched to each other, then using the difference in voltages across load elements 150 and 120 results in $A_d$, $A_{cm}$ and CMRR are described by the following equations:

Differential Gain $(Ad) \approx 2*R*\sqrt{2*ICM*\beta}$

Common Mode Gain $(Acm) \approx 0$ (due to matched currents paths)

CMRR $(Ad/Acm) \approx \geq$ $$I_{CM} \approx \frac{\beta}{2}(V_{CM} - V_T)^2$$

Note that the CMRR is relatively independent of the common mode, as long as $I_{CM}$ is kept much larger than 0 ($V_{CM} \gg V_T$). A very high CMRR results because the common mode gain approaches zero and the differential gain can be set high as long as $V_{CM} \gg V_T$. Because circuit 200 does not have a bias current, all of the power consumed by the circuit contributes directly to an optimal differential gain while effectively eliminating the common mode gain due to the symmetry of the matched current paths. Therefore, optimizing CMRR.

Also, because there is not a bias current in circuit 200, CMR is as wide as $V_T$ will allow for any given power. As the common mode voltage approaches the voltage of either supply, the differential current paths I+ and I− through 150 and 120, still detect any changes around the common mode. This stays true up until a threshold drop from the supply voltages. At this point, either the top two or the bottom two matched transistors, 110, 130, 140, and 160 will enter into cutoff. The following embodiments allow for more optimal differential gain across all possible common modes by allowing $I_{CM}$ to be optimally set even when the common mode is at the supply voltages (making $I_{CM}$ independent of $V_T$).

Figure 4:
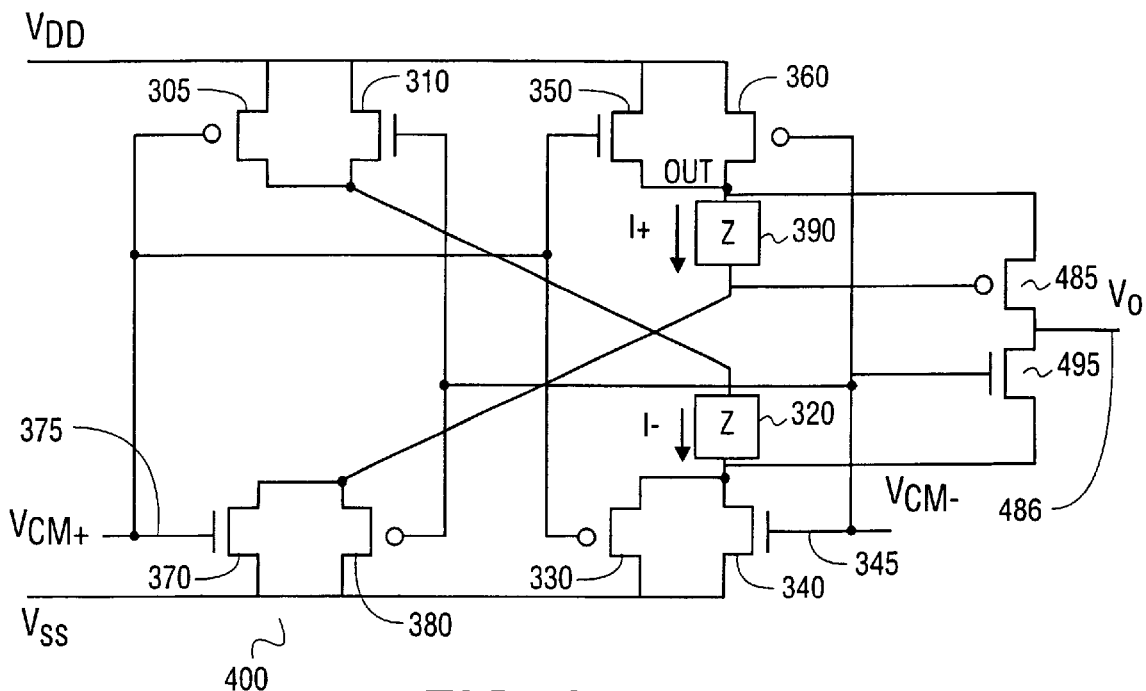
FIG. 4 is an embodiment of the present invention for optimal gain coupled to a gain stage.
Figure 3:
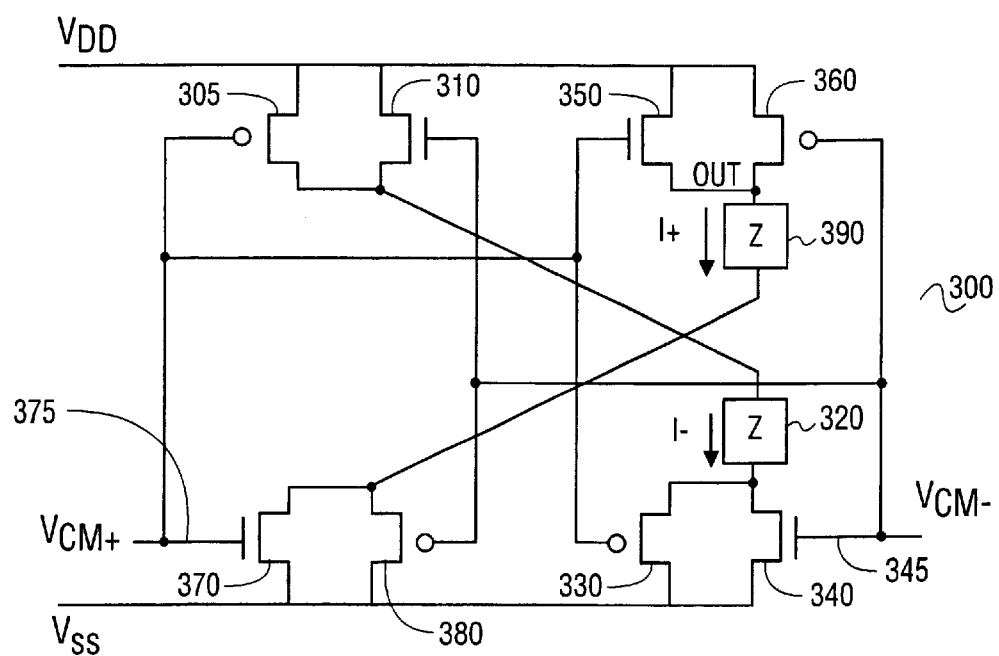
FIG. 3 is an embodiment of the present invention for optimal gain.

Another embodiment is illustrated in FIG. 3. The circuit 300 illustrated in FIG. 3, includes two matched differential paths that are comprised of two differential groups (transistors 305, 310, 350, 360 and transistors 330, 340, 370, 380) each having two input paths and two output paths. The first differential group (transistors 305, 310, 350 and 360) is referenced to a first supply node, $V_{DD}$. The second differential group (transistors 330, 340, 370 and 380) is referenced to a second supply node, $V_{SS}$. A first load element 320 is coupled between the transistor pair 305 and 310, and the transistor pair 330 and 340. A second load element 390 is coupled between the transistor pair 350 and 360, and the transistor pair 370 and 380. Differential input nodes are labeled 375 and 345. Where the common mode input node 375 ($V_{CM+}$) is the non-inverting differential input node, and the common mode input node 345 ($V_{CM-}$) is the inverting differential input node. Additionally, as illustrated in FIG. 4, a gain stage may be coupled to the circuit 300 resulting in the circuit 400 illustrated in FIG. 4. The gain stage has a gain output node 486 coupled across the two impedance elements 320 and 390. The matched current differential amplifier coupled to a gain stage 400, shown in FIG. 4, consists of the following p-MOSFETs 305, 330, 360 and 380 in the matched current differential amplifier, and transistor 485 in the gain stage. The circuit 400 in FIG. 4 consists of the following n-MOSFETs 310, 340, 350 and 370 in the matched current differential amplifier, and transistor 495 in the gain stage. The load elements 320 and 390 can be comprised of, but not limited to, transistors (for active resistors) or passive resistors.

If the betas of transistors 305, 340, 360, and 370 are matched to each other and the betas of transistors 310, 330, 350, and 380 are matched to each other, and both the inverting differential input node 345 and the non-inverting differential node 375 are connected to the same voltage (a common mode between supply voltages $V_{DD}$ and $V_{SS}$), then the current through the load impedances 390 and 320 are matched. The current through load impedance 390 will be the same as that of the current through load impedance 320. Assuming the betas of transistors 485 and 495 are matched, then the current through transistor 485 will match the current through transistor 495. The voltage at the gain output node 386 ($V_O$) will be midway between the supply voltages.

When the non-inverting differential input node 375 ($V_{CM+}$) increases to a higher voltage than that of the fixed common mode voltage at the inverting differential input node 345 ($V_{CM-}$), the current I+ through load element 390 increases and the current I− through load element 320 decreases. The current through transistor 485 then mirrors the increased current I+. Correspondingly, the current through transistor 495 then mirrors the decreased current of I−. This results in a higher voltage at $V_O$ 486. It follows that the voltage at $V_O$ decreases upon the non-inverting differential input 375 ($V_{CM+}$) decreasing below the inverting differential input node that is still fixed at a common mode. Therefore, by fixing the non-inverting input VCM+ to a common mode, $V_O$ increases as $V_{CM-}$ decreases, and $V_O$ decreases as $V_{CM-}$ increases. Since the gain output $V_O$ (486) is equally determined from current path 1+ and I−, any common mode gain in the current paths I+ and I− essentially cancels.

For an embodiment when the load impedance elements 390 and 320 are, passive or active resistors with resistance R, and the betas of transistors 305, 340, 360, and 370 are matched to each other as the value β and the betas of transistors 310, 330, 350, and 380 are matched to each other as the value $\beta_E$, then $A_d$, $A_{cm}$ and CMRR are described by the following equations:

Differential Gain $(Ad) \approx 2*R*\sqrt{2*ICM*\beta}$

Common Mode Gain $(Acm) \approx 0$ (due to matched currents paths)

CMRR (Ad/Acm)≈∞

$$I_{CM} \approx \frac{\beta}{2}(V_{CM} - V_T)^2 + \frac{V_{DD} - V_{SS}}{R} * \sqrt{\frac{\beta_E}{2}}$$

Circuit 400 ensures a high current when operating at extreme common modes by sizing $\beta_E$ such that matched currents at the extreme common modes equals the matched currents at the center common modes. The threshold voltage drop of circuit 200 is no longer a limit. This is because even when the common mode is at the high or low supply voltages, there will be equal common mode currents flowing through load impedances 320 and 390, ensuring differential gain across all common modes. Therefore, optimal performance across all possible common modes, from the lowest supply voltage to the highest is achieved.

Figure 5:
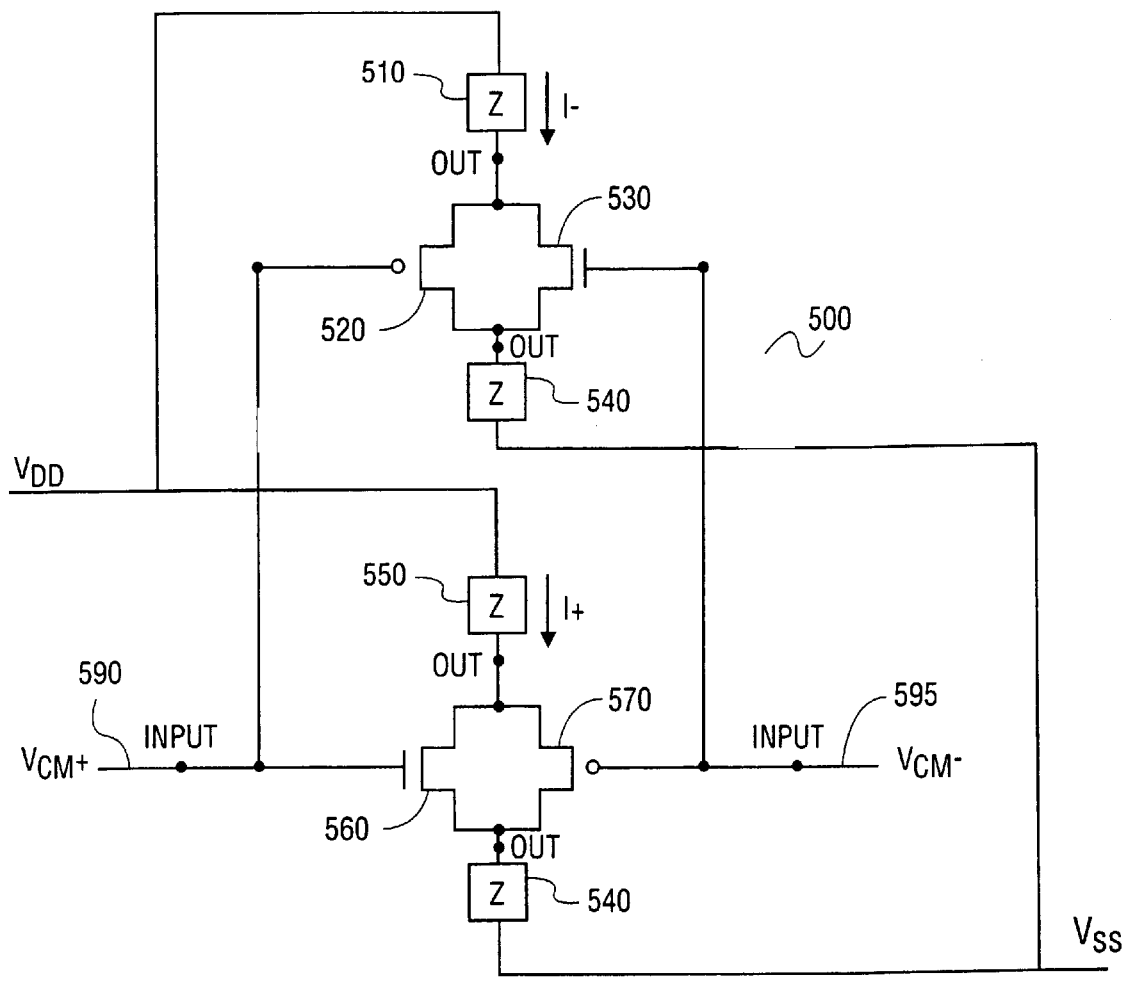
FIG. 5 is an embodiment of the present invention for even gain across a common mode range.
Figure 6:
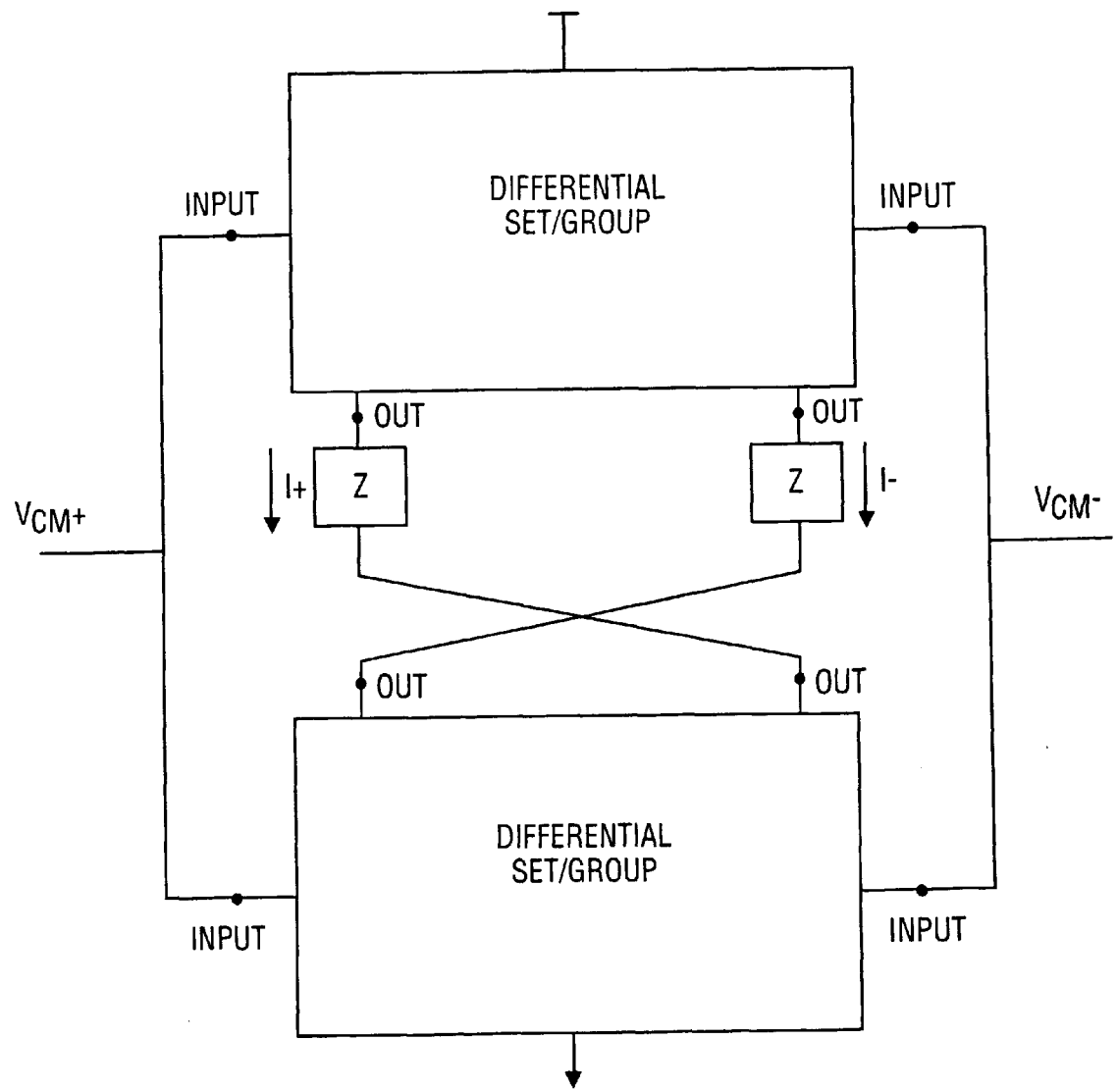
FIG. 6 is a block diagram of an embodiment of the present invention.

Another embodiment is illustrated in FIG. 5. The circuit 500 illustrated in FIG. 5, includes two matched differential paths comprised of a first differential set (transistors 520, 530, 560, 570) having two input paths and four output paths. A first load element 510 is coupled between the first differential set and a first supply node, $V_{DD}$. A second load element 540 is coupled between the first differential set and a second supply node, $V_{SS}$. A third load element 550 is coupled between the first differential set and a first supply node, $V_{DD}$. A fourth load element 580 is coupled between the first differential set and a second supply node, $V_{SS}$. Differential input nodes are labeled 590 and 595. Where common mode input node 590 ($V_{CM+}$) is the non-inverting differential input node, and common input node 595 ($V_{CM-}$) is the inverting differential input node. Additionally, a gain stage may be coupled to the circuit 500. The circuit 500 is comprised of p-MOSFETs 520 and 570, and n-MOSFETs 530 and 560. The load elements 510, 540, 550 and 580 can be comprised of, but not limited to, transistors (for active resistors) or passive resistors.

If the betas of transistors 520, 530, 560 and 570 are matched to each other, and both the inverting differential input node 595 and the non-inverting differential node 590 are connected to the same voltage (a common mode between supply voltages $V_{DD}$ and $V_{SS}$) then the current through the load impedances 510 and 540 will be the same as that of the current through load impedances 550 and 580. The voltage across the drains and sources of the transistors in the first differential set will be the same, setting the output voltage of a gain stage that can be connected to them to midway between the supply voltages. When the non-inverting differential input node $V_{CM+}$ (590) increases to a higher voltage than that of the fixed common mode voltage at the inverting differential input node 595 ($V_{CM-}$), the current I+ increases and the current I− decreases.

For the embodiment when the load elements are passive or active resistors with resistance R, and the betas of transistors 520, 530, 560 and 570 are matched to each other, as the value $\beta$, then $A_d$, $A_{cm}$ and CMRR are described by the following equations:

$$\text{Differential Gain } (A_d) \approx 4 * R * \frac{\sqrt{2 * I_{CM} * \beta}}{1 + \sqrt{2 * I_{CM} * \beta}}$$

Common Mode Gain (Acm)≈0 (due to matched currents paths)

CMRR (Ad/Acm)≈∞

$$I_{CM} \approx \frac{V_{DD} - V_{SS}}{2 * R} \text{(for } \beta \gg 0\text{)}$$

The threshold voltage drop of the circuit 200 illustrated in FIG. 2 is also no longer a limit here. This is because even when the common mode is athe high or and low supply voltages, there will be equal common mode current flowing through I+ and I−, ensuring differential gain. In this embodiment, more even, but less differential gain across all possible common modes, from the lowest supply voltage to the highest supply is achieved.

It should be noted that while the above discussion involved MOSFET transistors, bipolar junction transistors (BJTs) and junction field effect transistors (JFETs) can also be implemented with similar results. The embodiments of the invention described above are, of course, subject to other variations in structure and implementation. For instance, additional devices may be inserted between various nodes, terminals, and devices in the above embodiments without materially changing their overall function. For example, voltage drops may be introduced by resistors, diodes, or transistors configured as diodes, to change various voltage levels, or buffers may be inserted between various nodes, terminals, and devices. In general, the scope of the invention should be determined not by the embodiments illustrated but by the appended claims and their legal equivalents.

What is claimed is:

1. A circuit, comprising:
   a first differential set and a second differential set each having a first and a second input node and a first and a second output node, the first differential set referenced to a first supply node and the second differential set referenced to a second supply node, the first input node of the first differential set coupled to the first input node of the second differential set, and the second input node of the first differential set coupled to the second input node of the second differential set;
   a first load element cross coupled between the second output node of the second differential set and the first output node of the first differential set; and
   a second load element cross coupled between the second output node of the first differential set and the first output node of the second differential set.

2. The circuit of claim 1, further comprising:
   a gain stage coupled across the first load element and the second load element, the gain stage having a gain output node.

3. The circuit of claim 1, further comprising:
   a first gain transistor coupled between a gain output node and the first load element; and
   a second gain transistor coupled between the gain output node and the second load element.

4. The circuit of claim 3, wherein the first differential comprises a first complementary pair of MOSFETs, and the second differential set comprises a second complementary pair of MOSFETs.

5. The circuit of claim 4, wherein the first load element is one of a passive resistor and a transistor.

6. The circuit of claim 5, wherein betas of the first gain transistor and the second gain transistor are matched, and the betas of each of the first complementary pair of MOSFETs and each of the second complementary pair of MOSFETs are matched.

7. A circuit, comprising:
   a first differential group and a second differential group each having a first and a second input node and a first and a second output node, the first differential group referenced to a first supply node and the second differential group referenced to a second supply node, the first input node of the first differential group coupled to the first input node of the second differential group, and the second input node of the first differential group coupled to the second input node of the second differential group;

a first load element cross coupled between the second output node of the first differential group and the first output node of the second differential group; and a second load element cross coupled between the second output node of the second differential group and the first output node of the first differential group.

8. The circuit of claim 7, further comprising:

a gain stage coupled across the first load element and the second load element, the gain stage having a gain output node.

9. The circuit of claim 7, wherein the first differential group comprises a first and a second pair of complementary MOSFETs, and the second differential group comprises a first and a second pair of complementary MOSFETs.

10. The circuit of claim 9, wherein the first load element and the second load element is one of a passive resistor and a transistor.

11. The circuit of claim 9, wherein betas of the first gain transistor and the second gain transistor are matched, and the betas of the first pair of complementary MOSFETs of the first differential group and the betas of the second pair of complementary MOSFETs of the second differential group are matched, and the betas of the second pair of complementary MOSFETs of the first differential group are matched to the betas of the first pair of complementary MOSFETs of the second differential group.

12. A circuit, comprising:

a first differential group and a second differential group each having a first and a second input node and a first and a second output node, the first differential group referenced to a first supply node and the second differential group referenced to a second supply node, the first input node of the first differential group coupled to the first input node of the second differential group, and the second input node of the first differential group coupled to the second input node of the second differential group;

a first load element cross coupled between the second output node of the first differential group and the first output node of the second differential group;

a second load element cross coupled between the second output node of the second differential group and the first output node of the first differential group and a first gain transistor coupled between a gain output node and the first load element; and a second gain transistor coupled between the gain output node and the second load element.

13. The circuit of claim 12, wherein the first differential group includes a first and a second pair of complementary MOSFETs, and the second differential group includes a first and a second pair of complementary MOSFETs.

14. The circuit of claim 13, wherein the first load element and the second load element is one of a passive resistor and a transistor.

15. The circuit of claim 14, wherein betas of the first gain transistor and the second gain transistor are matched, and betas of the first pair of complementary MOSFETs of the first differential group and betas of the second pair of complementary MOSPETs of the second differential group are matched, and betas of the second pair of complementary MOSFETs of the first differential group are matched to betas of the first pair of complementary MOSPETs of the second differential group.

* * * * *

UNITED STATES PATENT AND TRADEMARK OFFICE
CERTIFICATE OF CORRECTION

PATENT NO.     : 6,411,132 B2
DATED          : June 25, 2002
INVENTOR(S)    : Griffin It is certified that error appears in the above-identified patent and that said Letters Patent is hereby corrected as shown below:

Column 1,
Lines 40 through 50, delete "Increasing the common mode input voltage VCM helps reduce common mode gain, thus improving CMRR. But this means that the CMR will be constrained to the "high" side of the power supply. Thus, a wider CMR may only be obtained at the expense of a lower CMRR. Increasing the common mode input voltage VCM helps reduce common mode gain, thus improving CMRR. But this means that the CMR will be constrained to the "high" side of the power supply. Thus, a wider CMR may only be obtained at the expense of a lower CMRR.".

Column 2,
Lines 37-38, delete "transistor 140 and transistor 160" and insert -- transistor 110 and transistor 130 --.
Line 39, delete "transistor 110 and transistor 130" and insert -- transistor 140 and transistor 160 --.

Column 5,
Line 45, delete "voltage" and insert -- voltages --.
Line 7, delete "athe high or and low" and insert -- at the high or low --.

Signed and Sealed this

Seventeenth Day of December, 2002

JAMES E. ROGAN
*Director of the United States Patent and Trademark Office*